(12) United States Patent
Sanduleanu et al.

(10) Patent No.: US 7,245,181 B2
(45) Date of Patent: Jul. 17, 2007

(54) LINEAR AMPLIFIER

(75) Inventors: Mihai Adrian Tiberiu Sanduleanu, Eindhoven (NL); Eduard Ferdinand Stikvoort, Eindhoven (NL)

(73) Assignee: PXP B.V., Eindhoven (NL)

( * ) Notice: Subject to any disclaimer, the term of this patent is extended or adjusted under 35 U.S.C. 154(b) by 156 days.

(21) Appl. No.: 10/551,027

(22) PCT Filed: Mar. 26, 2004

(86) PCT No.: PCT/IB2004/050346

§ 371 (c)(1),
(2), (4) Date: Sep. 29, 2005

(87) PCT Pub. No.: WO2004/088838

PCT Pub. Date: Oct. 14, 2004

(65) Prior Publication Data

US 2006/0250185 A1 Nov. 9, 2006

(30) Foreign Application Priority Data

Apr. 4, 2003 (EP) .................. 03100900

(51) Int. Cl.
*H03F 3/45* (2006.01)
(52) U.S. Cl. .................. 330/253; 330/124 R; 330/302

(58) Field of Classification Search ................ 330/253, 330/124 R, 302
See application file for complete search history.

(56) References Cited

U.S. PATENT DOCUMENTS

| 4,887,047 | A | * | 12/1989 | Somerville .................. 330/257 |
| 5,847,600 | A | * | 12/1998 | Brooks et al. ................. 330/9 |
| 6,404,285 | B1 | | 6/2002 | Shkap |
| 6,750,727 | B1 | * | 6/2004 | Sutardja ................. 331/117 R |
| 6,985,035 | B1 | * | 1/2006 | Khorramabadi ............. 330/253 |
| 7,068,104 | B2 | * | 6/2006 | Burns et al. ................ 330/253 |
| 7,113,744 | B1 | * | 9/2006 | Moloudi et al. .............. 455/20 |

* cited by examiner

*Primary Examiner*—Patricia Nguyen

(57) ABSTRACT

A linear amplifier circuit comprising a first differential amplifier (DA1) having a differential input terminals (I+, I−) for receiving a binary input signal, and a differential output terminals (O+,O−), a second differential amplifier (DA2) having input terminals coupled to the differential input terminals (I+, I−). The amplifier further comprises, a third differential amplifier (DA3) coupled in cascade to the second differential amplifier (DA2) and having its output cross-coupled to the differential output terminals in a feedforward connection, and a capacitor (C) coupled to the third differential amplifier (DA3) for determining an increase of a bandwidth of the linear amplifier, a current flowing through the capacitor (C) being proportional with a derivative of the differential input signal (I+, I−).

9 Claims, 3 Drawing Sheets

LINEAR AMPLIFIER

Figure 1:
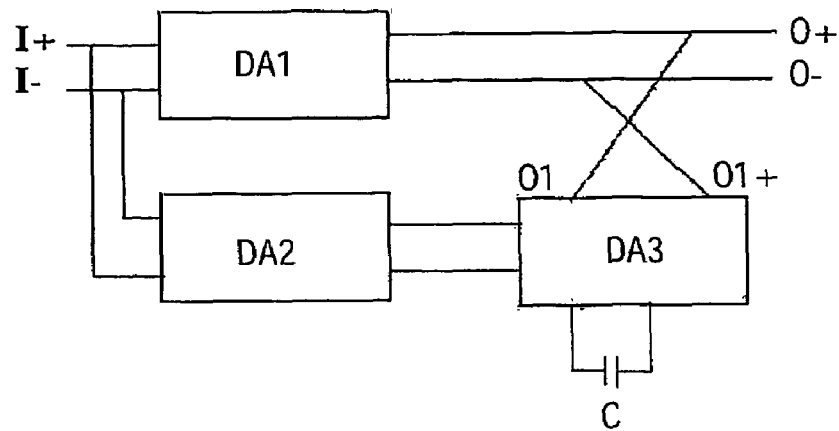

The invention relates to a linear amplifier. The invention further relates to a limiting amplifier comprising the linear amplifier.

Linear amplifiers are widely used in relatively high frequency applications as receivers and transmitters. When the input signals are binary signals i.e. having a LOW value and HIGH value situated in a relatively large range e.g. GHz the necessary bandwidth of the amplifier is relatively large. Furthermore, the amplifier need to provide a relatively constant gain with a minimum level of distortion for both relatively low level signals and high level signals.

U.S. Pat. No. 6,404,285 describes a differential amplifier used in an intermediate frequency, voltage gain amplifier to produce a substantially linear, differential output signal for both small and large differential input signals. The amplifier comprises a pair of transistors coupled at their emitters and being biased via another transistor having a base coupled to the differential input signal via a pair of resistors. It is observed that when the amplifier is directly implemented in CMOS technology, the resulting amplifier has a substantially lower amplification because a transconductance of the CMOS transistors is substantially lower, e.g. over 40 times lower than a transconductance of a bipolar transistor. Hence, an increase of the amplifier gain is necessary. Any increase of the gain of the amplifier determines a smaller available bandwidth for an input signal because for a given amplifier a so-called gain-bandwidth product is a relatively constant parameter.

It is therefore an object of this invention to provide a linear amplifier implemented in CMOS technology that mitigates the above-mentioned problems.

The invention is defined by the independent claims. The dependent claims define advantageous embodiments.

The cross-coupled output terminals determine a feed-forward determining a supplementary amplification of the input signal. A suitable chosen capacitor's value determines an increase of the available bandwidth of the amplifier. Subsequently, rising and falling edges of a binary input signal are not substantially distorted.

In an embodiment of the invention the first differential amplifier comprises a first transistor pair coupled to a common drain transistor pair via resistors means, a current through the common drain transistor pair improving a linearity of the first differential amplifier. The second differential amplifier comprises a second transistor pair being supplied with a substantially equal current as the first differential amplifier.

The third differential amplifier may comprise a third transistor pair having their respective source terminal coupled via the capacitor. Let us consider that the first pair of transistors comprises transistors having the same area and that the transistors included in the common drain transistor pair have a different area. Let us further note the resistor means as R and the current flowing through it as i. The following relations may be written:

$$\begin{cases} V_{ID} = 2iR \\ V_{ID} = \sqrt{\dfrac{2i_1}{\beta_1}} - \sqrt{\dfrac{2i_3}{\beta_3}} + iR \\ V_{ID} = \sqrt{\dfrac{2i_3}{\beta_3}} - \sqrt{\dfrac{2i_2}{\beta_1}} + iR \\ i_3 = I_0 - (i_1 + i_2) \end{cases} \quad (1)$$

In relations (1) $\beta_1$ and $\beta_3$ are coefficients related to the dimensions of the pair of transistor and common drain transistors, respectively. $V_T$ is a threshold voltage of the transistors. $i_1$ and $i_2$ are the currents through the pair of transistors. $V_{iD}$ is the differential input signal and $I_B$ is the bias current for both first transistor pair and second transistor pair. $i_3$ is a current through the common drain transistor pair. $i_3$ is quadratic with respect to the input differential voltage $V_{iD}$ as in eq. (2).

$$i_3 = \dfrac{I_0}{1 + 2\left(\dfrac{W_1}{W_3}\right)} \left(1 - \dfrac{\beta_1 V_{ID}^2}{4I_0}\right) \quad (2)$$

The differential output current depends on the differential input voltage as shown in equation (3):

$$i_{OD} = i_1 - i_2 = \beta_1 \sqrt{\dfrac{2I_0}{\beta_3\left(1 + 2\dfrac{W_1}{W_3}\right)}} \cdot V_{ID} \sqrt{1 - \dfrac{\beta_1 V_{ID}^2}{4I_0}} \quad (3)$$

It is to be mentioned here that the term $\beta_1 V_{iD}^2$ has dimension of a current. It is further observed that if $I_B$ is chosen such that $\beta_1 V_{iD}^2 \ll I_B$ then relation (3) reduces to relation (4).

$$i_{OD} \approx \beta_1 \sqrt{\dfrac{2I_0}{\beta_3\left(1 + 2\dfrac{W_1}{W_3}\right)}} \cdot V_{ID} \quad (4)$$

Hence, the current is linearly dependent on the differential input voltage. When using the capacitor equation (4) may be re-written as in equation (5).

$$i_{OD}(t) \approx \beta_1 \sqrt{\dfrac{2I_0}{\beta_3\left(1 + 2\dfrac{W_1}{W_3}\right)}} \cdot \left[V_{ID} + \tau(C)\dfrac{\delta V_{ID}}{\delta t}\right] \quad (5)$$

In relation (5) $\tau(C)$ is a time-constant depending on the value of the capacitor and an output impedance of the second transistor pair. If we denote this impedance as R2 and the capacitor's value as C then the time-constant equals R2*C. It is easily seen from relation (5) that the capacitor improve the amplifier performance when binary signals are used and the term $$\frac{\delta V_{ID}}{\delta t}$$

has a significant value even when the input signal has a relatively small value.

In another embodiment, the linear amplifier is used in limiter amplifier comprising a chain of linear amplifiers. The limiting amplifier further comprises a plurality of limiting amplifiers coupled in cascade and further coupled to the chain of linear amplifiers and providing a limited differential signal. Limiter amplifiers are widely used in receivers and transmitters of frequency modulated signals. They usually comprise a high gain amplifier cascaded with a Gilbert cell for providing binary type of signals. When the input signals are already binary and situated in a relatively high frequency range the linear amplifier may comprise a plurality of linear amplifiers as previously described.

In another embodiment of the invention the limiter amplifier further comprises a feedback differential integrator for adjusting an offset voltage of the limiter amplifier. A cut-off frequency of the integrator is chosen substantially lower than the frequency range of the input signals in the limiter. The integrator provides a relatively constant output signal for adjusting the off-set of the limiter.

In another embodiment of the invention at least one of the limiting amplifiers of the plurality of limiting amplifiers has its input terminals coupled via a series coupled substantially equal resistors for providing a common mode signal. The common mode signal is provided to a replica biasing circuit generating a compensation signal biasing the chain of linear amplifiers and the plurality of limiting amplifiers. The compensation signal is mainly determined by the common mode signal, which in turn is determined by temperature variations. For example an increase of the temperature determines a decrease in gain of the amplifier and the compensation signal determines a gain of the limiter to be relatively constant.

The replica biasing circuit may comprise a pair of replica transistors having coupled their respective terminals i.e. drain to drain, source to source and gate to gate, their gates being coupled to the common mode signal, a transconductance amplifier generating the compensation signal which is proportional with a difference between a reference signal and a voltage in the drains of the of the pair of replica transistors.

The reference signal may be a band-gap voltage generator. The common mode signal is measured at the input of one of the limiting amplifier. The transconductance amplifier compares the voltages in the drains of the pair of replica transistors with the band-gap voltage and generating an output current that depends on temperature and technological process. The current is further used to adjust the bias currents in the linear amplifiers and limiting amplifiers.

Figure 2:
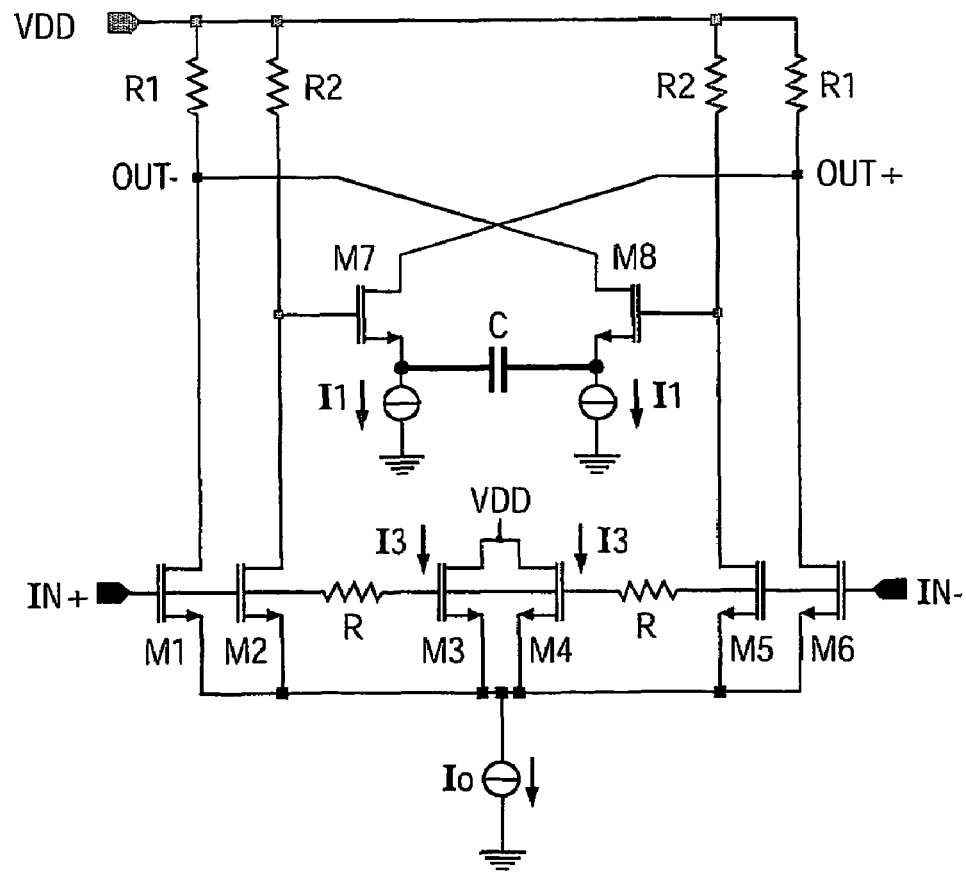
Figure 3:
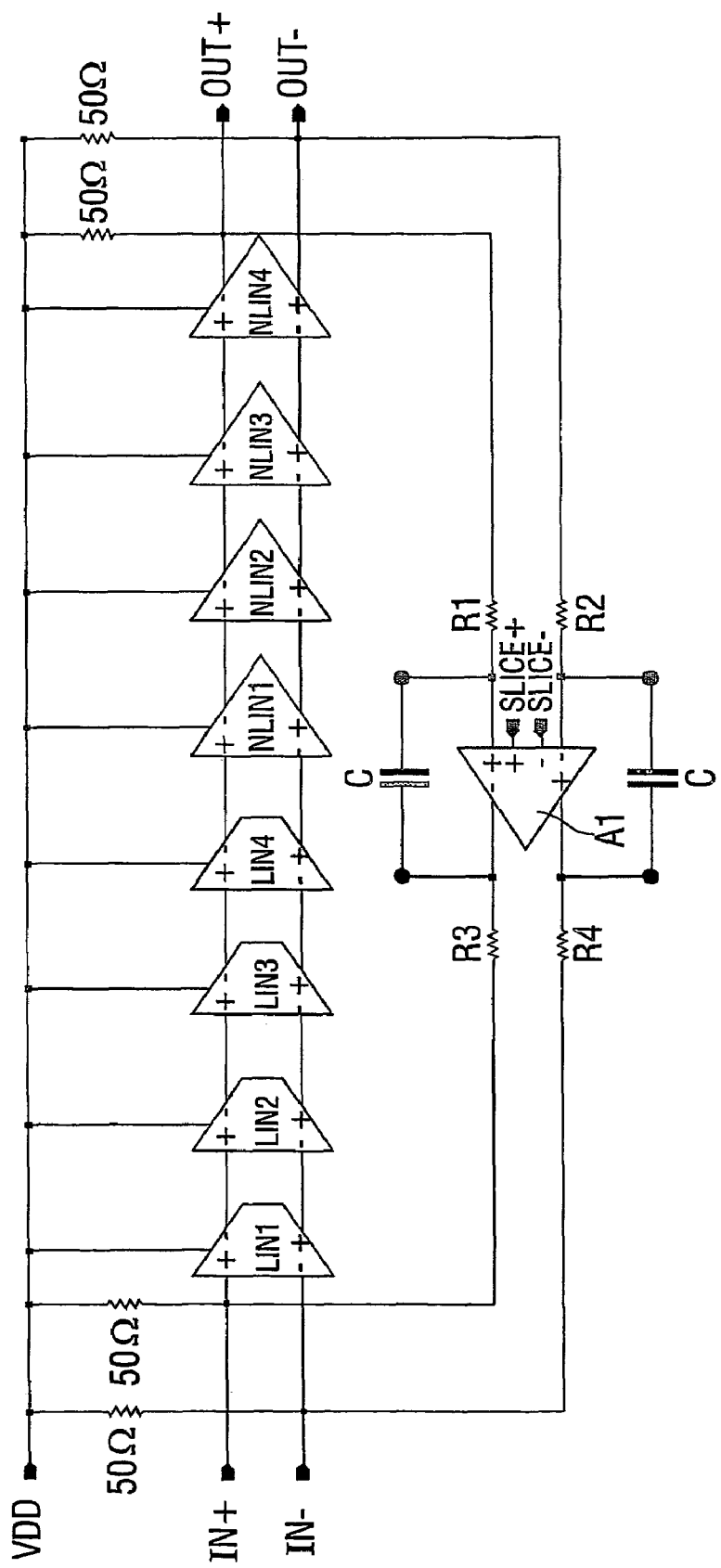
Figure 4:
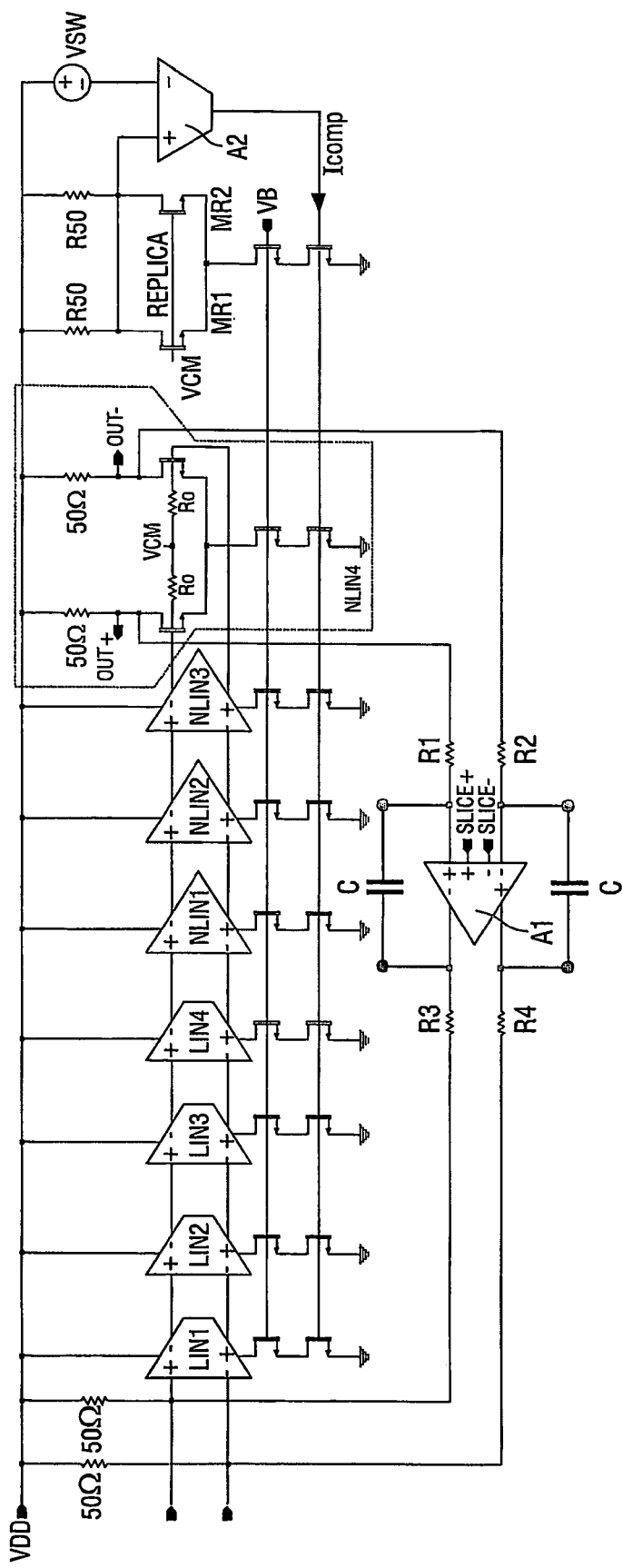

The above and other features and advantages of the invention will be apparent from the following description of the exemplary embodiments of the invention with reference to the accompanying drawings, in which:

FIG. 1 depicts a block representation of a linear amplifier according to the invention, FIG. 2 depicts a more detailed representation of a linear amplifier according to one embodiment of the invention, FIG. 3 depicts a block diagram of a limiter amplifier according to the invention, FIG. 4 depicts a more detailed representation of the limiter amplifier according to the invention, FIG. 1 depicts a block representation of a linear amplifier according to the invention. The linear amplifier circuit comprises a first differential amplifier DA1 having a differential input terminals I+, I− for receiving a binary input signal and a differential output terminals O+, O−. The linear amplifier further comprises a second differential amplifier DA2 having input terminals coupled to the differential input terminals I+, I−. The linear amplifier circuit includes a third differential amplifier DA3 coupled in cascade to the second differential amplifier DA2 and having its output terminals O1+, O1− cross-coupled to the differential output terminals in a feed-forward connection i.e. O1+ coupled to O− and O1− coupled to O+. Signs + and − indicate non-inverting output and inverting output, respectively. Furthermore, an inverting output generates a signal substantially in antiphase to the input signal and a non-inverting output generates a signal substantially in phase with the input signal.

A capacitor C is coupled to the third differential amplifier DA3 for determining an increase of a bandwidth of the linear amplifier, a current flowing through the capacitor C being proportional with a derivative of the differential input signal I+, I−.

A CMOS implementation of the linear amplifier is shown in FIG. 2. The first differential amplifier DA1 comprises a first transistor pair M1, M6 coupled to a common drain transistor pair M3, M4 via resistors R. A current through the common drain transistor pair 13 improving a linearity of the first differential amplifier DA1 as results from relations 1 to 5. The second differential amplifier DA2 comprises a second transistor pair M2, M5, which is supplied with a substantially equal current as the first differential amplifier DA1. It is observed that the transistors M1, M6, M2, M5 have substantially the same area and are supplied from a same current source I0. Hence, the current through the transistors is substantially equal to each other. The third differential amplifier DA3 comprises a third transistor pair M7, M8 having their respective source terminal coupled via the capacitor C. The input signal I+, I− is linearly replicated in the drains of transistors M2 and M5 and consequently, in the sources of transistors M7 and M8. The current flowing in the capacitor is the derivative of the input voltage cross-injecting current at the output nodes through M7 and M8. The current I1 is small in comparison with the current I0 and the dimensions of the transistors M7 and M8 are smaller than the dimensions of transistors M1 and M6. Choosing adequately the dimensions of the transistors and the time constant $R_2C$, the small signal bandwidth of the circuit almost doubles and in a transient state one may observe smaller rise and fall times. This circuit may be cascaded directly with the next stage without the need of source followers, undesired in this technology.

The first four stages are identical and once the signal has been amplified to reasonable levels, the next four stages can limit the input signal accordingly. The next limiting stages are based on differential pairs except for the last stage where a replica biasing circuit has been added (see FIG. 4).

FIG. 3 depicts a block diagram of a limiter amplifier according to the invention. It comprises a chain of linear amplifiers LIN1, LIN2, LIN3, LIN4 as shown in FIG. 51, a plurality of limiting amplifiers NLN1, NLN2, NLN3, NLN4 coupled in cascade and further coupled to the chain of linear amplifiers LIN1, LIN2, LIN3, LIN4 and providing a limited differential signal OUT+, OUT−. The limiter amplifier further comprises a feedback differential integrator A1, R1, R2, R3, R4, C1, C2 for adjusting an offset voltage of the limiter amplifier. The gain of each linear amplifier LIN1, LIN2, LIN3, LIN4 is chosen around 4 dB for bringing small signals present at the input to a sufficient large signal needed by the next limiting amplifiers. Although the process limits the gain-bandwidth product of one stage, gain distribution boosts the total gain-bandwidth product of the complete limiter. The main requirement here is to reduce the group-delay distortion of the gain stages by ensuring that peaking at high frequency of the linear blocks is limited. Finally a gain of 52 dB is achieved with a total small signal bandwidth of 10 GHz. The feedback differential integrator A1, R1, R2, R3, R4, C1, C2 amplifies the offset from the output and feeds back a correction signal at the input necessary to compensate the offset. Using the resistive divider R3, R4 and the 50Ω input resistors the time constant of the loop is increased. Considering that A is the gain of the limiter and neglecting, in a first instance, its frequency roll-off and if τ denotes the time constant of the integrator and α the attenuation of the resistive divider at the input, then, the closed loop gain of the limiter is:

$$\frac{V_O}{V_I} = \frac{A(1 + j\omega\tau B)}{(1 + AB\alpha) + j\omega\tau B} \quad (6)$$

The low-frequency pole, which may be approximated by Aα/τ depends not only on the integrator time constant τ but also on the attenuation factor α. Hence, one may integrate an effective time-constant corresponding to a cut-off frequency of 1 KHz with small integration capacitors.

FIG. 4 depicts a more detailed representation of the limiter amplifier according to the invention. The limiter amplifier further comprises a replica biasing circuit providing a compensation signal Icomp biasing the chain of linear amplifiers LIN1, LIN2, LIN3, LIN4 and the plurality of limiting amplifiers NLN1, NLN2, NLN3, NLN4. The replica biasing circuit comprises a pair of replica transistors MR1, MR2 having coupled their respective terminals i.e. drain to drain, source to source and gate to gate, their gates being coupled to the common mode signal. A transconductance amplifier A2 generates the compensation signal Icomp which is proportional with a difference between a reference signal VSW and a voltage in the drains of the of the pair of replica transistors MR1, MR2.

The replica biasing circuit ensures constant swing with temperature and with a change with temperature of the currents in the limiter for compensating the decrease in gain of the stages for higher temperatures. The voltage VSW is a bandgap reference voltage. The replica biasing circuit is matched well with temperature/process with the last stage of the limiter. The common-mode voltage VCM is measured at the input of the last stage. The transconductance amplifier A2 compares the voltages on the resistors R50 with the voltage VSW adjusting the current I0 in the tails of the circuit with temperature and process. In one embodiment, the resistance of R50 is 50 ohm.

It is remarked that the scope of protection of the invention is not restricted to the embodiments described herein. Neither is the scope of protection of the invention restricted by the reference numerals in the claims. The word 'comprising' does not exclude other parts than those mentioned in the claims. The word 'a(n)' preceding an element does not exclude a plurality of those elements. Means forming part of the invention may both be implemented in the form of dedicated hardware or in the form of a programmed purpose processor. The invention resides in each new feature or combination of features.

The invention claimed is:

1. A linear amplifier circuit comprising:
   a first differential amplifier (DA1) having a differential input terminals (I+, I−) for receiving a binary input signal, and a differential output terminals (O+,O−),
   a second differential amplifier (DA2) having input terminals coupled to the differential input terminals (I+, I−),
   a third differential amplifier (DA3) coupled in cascade to the second differential amplifier (DA2) and having its output cross-coupled to the differential output terminals in a feed-forward connection, and
   a capacitor (C) coupled to the third differential amplifier (DA3) for determining an increase of a bandwidth of the linear amplifier, a current flowing through the capacitor (C) being proportional with a derivative of the differential input signal (I+, I−).

2. A linear amplifier as claimed in claim 1, wherein the first differential amplifier (DA1) comprises a first transistor pair (M1, M6) coupled to a common drain transistor pair (M3, M4) via resistor means (R), a current through the common drain transistor pair (I3) improving a linearity of the first differential amplifier (DA1).

3. A linear amplifier as claimed in claim 1, wherein the second differential amplifier (DA2) comprises a second transistor pair (M2, M5) being supplied with a substantially equal current as the first differential amplifier (DA1).

4. A linear amplifier as claimed in claim 1, wherein the third differential amplifier (DA3) comprises a third transistor pair (M7, M8) having their respective source terminal coupled via the capacitor (C).

5. A limiter amplifier comprising:
   a chain of linear amplifier circuits (LIN1, LIN2, LIN3, LIN4) as claimed in claim 1,
   a plurality of limiting amplifiers (NLN1, NLN2, NLN3, NLN4) coupled in cascade and further coupled to the chain of linear amplifiers (LIN1, LIN2, LIN3, LIN4) and providing a limited differential signal (OUT+, OUT−).

6. A limiter amplifier as claimed in claim 5 further comprising a feedback differential integrator (A1, R1, R2, R3, R4, C1, C2) for adjusting an offset voltage of the limiter amplifier.

7. A limiter amplifier as claimed in claim 5 wherein at least one of the limiting amplifiers (NLN4) of the plurality of limiting amplifiers (NLN1, NLN2, NLN3, NLN4) has input terminals coupled via series coupled substantially equal resistors (R0) for providing a common mode signal (VCM).

8. A limiter amplifier as claimed in claim 7 further comprising a replica biasing circuit providing a compensation signal (Icomp) biasing the chain of linear amplifiers (LIN1, LIN2, LIN3, LIN4) and the plurality of limiting amplifiers (NLN1, NLN2, NLN3, NLN4).

9. A limiter amplifier as claimed in claim 8, wherein the replica biasing circuit comprises:
   a pair of replica transistors (MR1, MR2) having coupled their respective terminals i.e. drain to drain, source to source and gate to gate, their gates being coupled to the common mode signal, and
   a transconductance amplifier (A2) generating the compensation signal (Icomp) which is proportional with a difference between a reference signal (VSW) and a voltage in the drains of the of the pair of replica transistors (MR1, MR2).

* * * * *